United States Patent [19]
Davis et al.

[11] 3,954,954
[45] May 4, 1976

[54] PLASMA METHOD AND APPARATUS FOR CARRYING OUT HIGH TEMPERATURE CHEMICAL REACTIONS

[75] Inventors: Robert D. Davis, Costa Mesa; Theodore N. Meyer, Laguna Beach; Roy L. Blizzard, Huntington Beach, all of Calif.

[73] Assignee: Plasmachem, Inc., Santa Ana, Calif.

[22] Filed: Jan. 2, 1974

[21] Appl. No.: 430,228

Related U.S. Application Data

[60] Division of Ser. No. 342,699, March 19, 1973, Pat. No. 3,840,750, which is a continuation-in-part of Ser. No. 303,707, Nov. 6, 1972, abandoned, which is a division of Ser. No. 125,589, March 18, 1971, Pat. No. 3,738,824.

[52] U.S. Cl. ............................... 423/492; 204/164
[51] Int. Cl.² ............... C01G 33/00; C01G 35/00; C01G 39/00; B01K 1/00
[58] Field of Search ........... 204/164, 165, 168, 169, 204/174, 177; 250/547; 423/492

[56] References Cited
UNITED STATES PATENTS

| | | | |
|---|---|---|---|
| 1,280,471 | 10/1918 | Hoofnagle............................ | 250/471 |
| 2,860,094 | 11/1958 | Ishizuka............................... | 204/164 |
| 3,280,018 | 10/1966 | Denis................................... | 204/165 X |
| 3,293,005 | 12/1966 | McCord............................... | 423/492 |
| 3,309,299 | 3/1967 | Mantell................................ | 204/165 |
| 3,320,023 | 5/1967 | George................................ | 423/492 X |
| 3,469,941 | 9/1969 | Kuhn................................... | 204/177 X |
| 3,652,434 | 3/1972 | Bar-Nun et al..................... | 204/158 S |
| 3,679,363 | 7/1972 | Skvivan............................... | 204/164 X |
| 3,708,409 | 1/1973 | Bainbridge.......................... | 204/164 |

*Primary Examiner*—F. C. Edmundson
*Attorney, Agent, or Firm*—Mahoney, Schick & Cislo

[57] ABSTRACT

In the process of carrying out high temperature, chemical reactions including reductions for producing elemental metal powders, especially refractory metals; chlorinations for producing halogens and for chemical synthesis in general using a plasma generator, the reactant or reactants feed material is introduced into the reaction zone of the apparatus and the effluent from the reaction zone is directed into a quenching zone through a selectively variable passageway or orifice in a manner that permits in the reduction process separation of the desired reaction product from the effluent hot gas stream and the continuous collection of the reaction product in a collection zone wherein in some instances, the reaction product is of a selected characteristic, controlled by the maintenance of certain operational parameters, including a selected differential fluid pressure in the reaction and collection zone as well as reaction and collection zone temperatures. Apparatus for carrying out the high temperature chemical reactions is disclosed.

5 Claims, 13 Drawing Figures

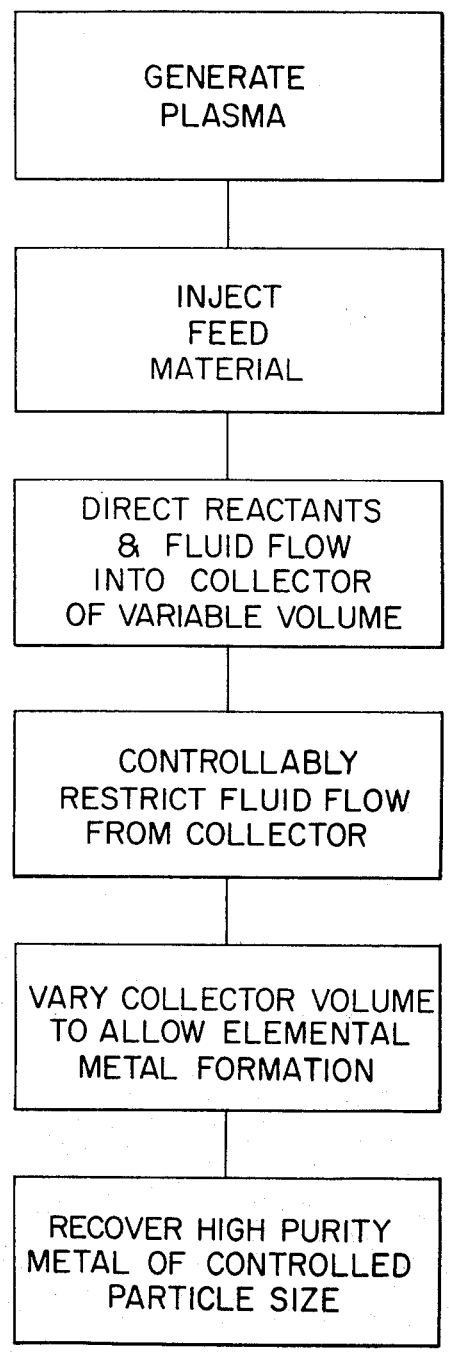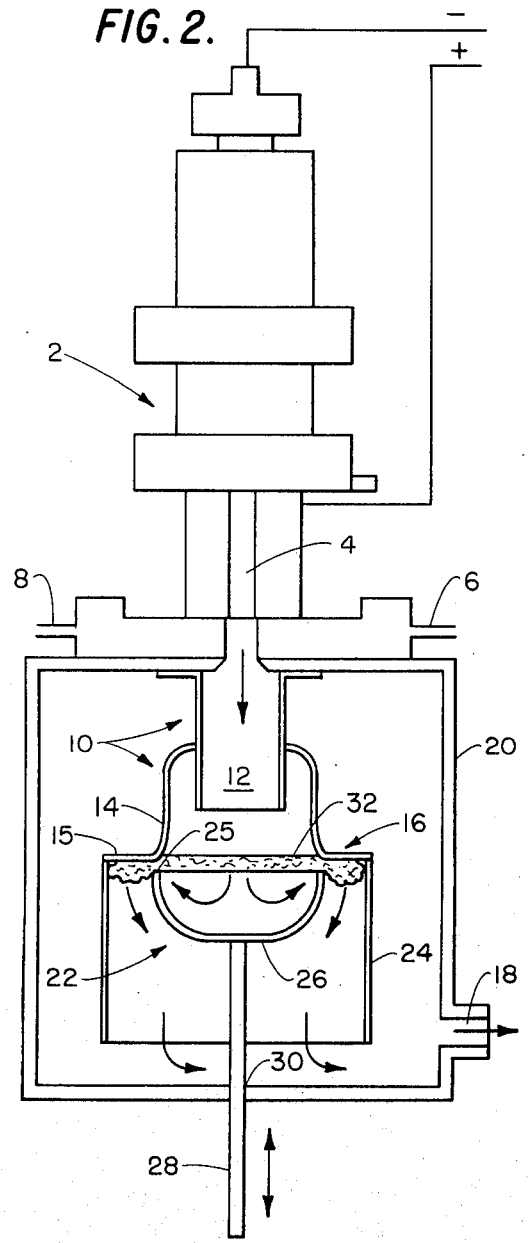

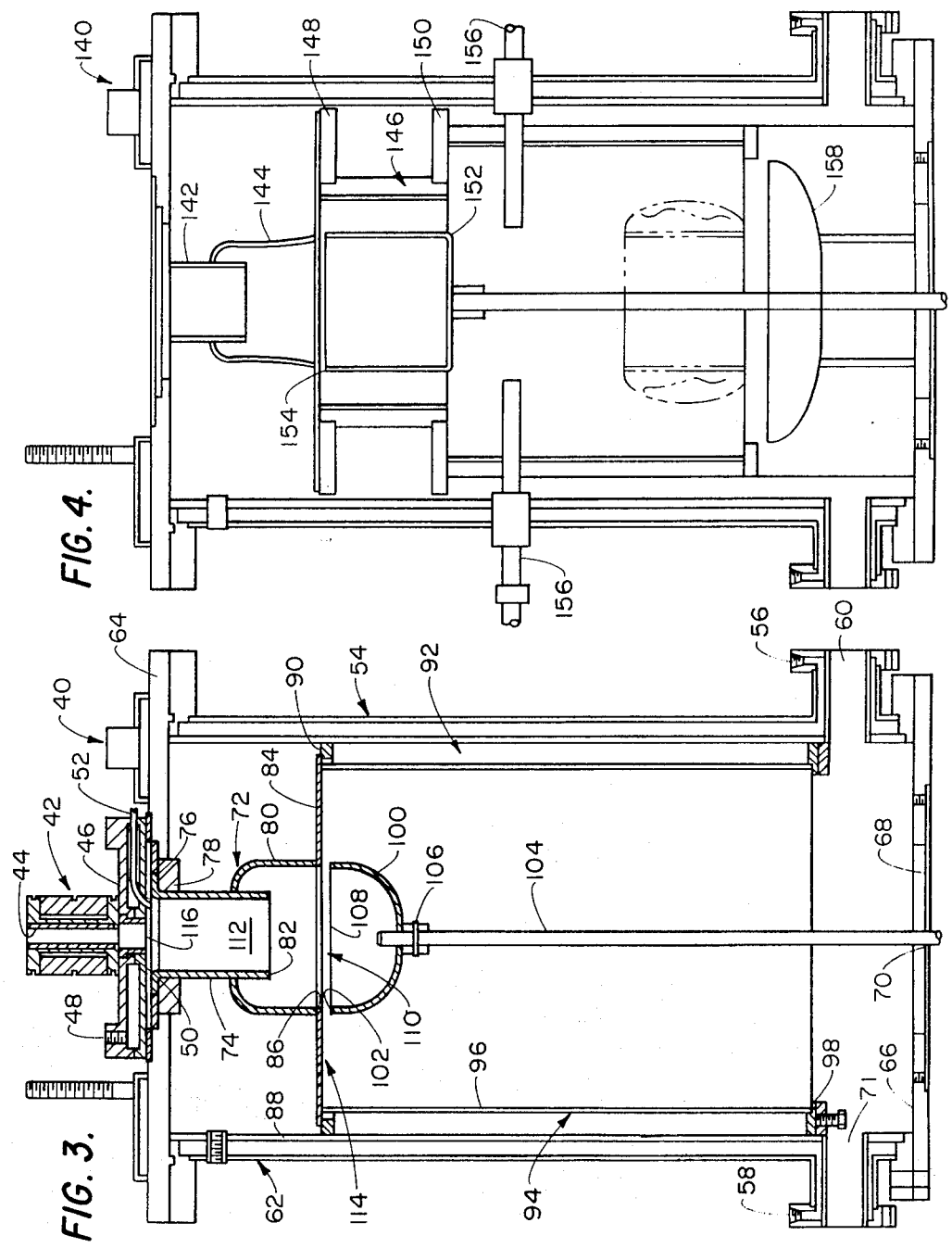

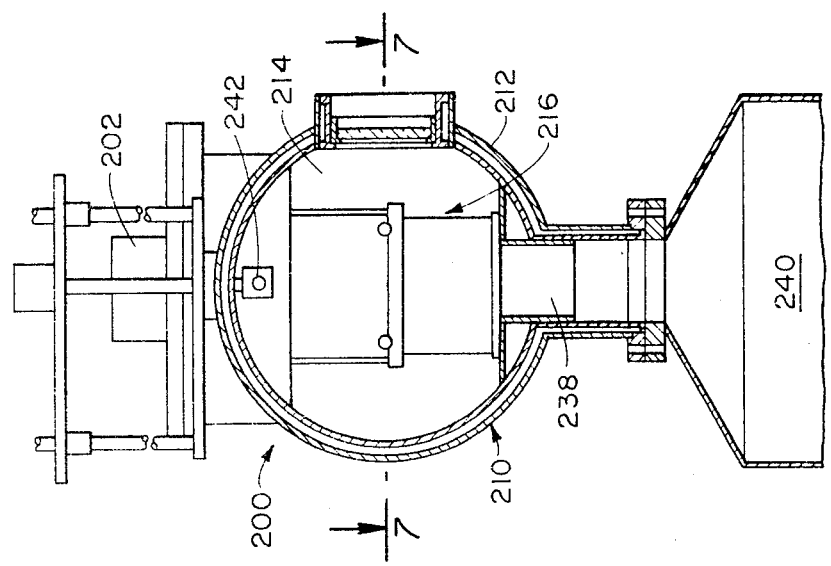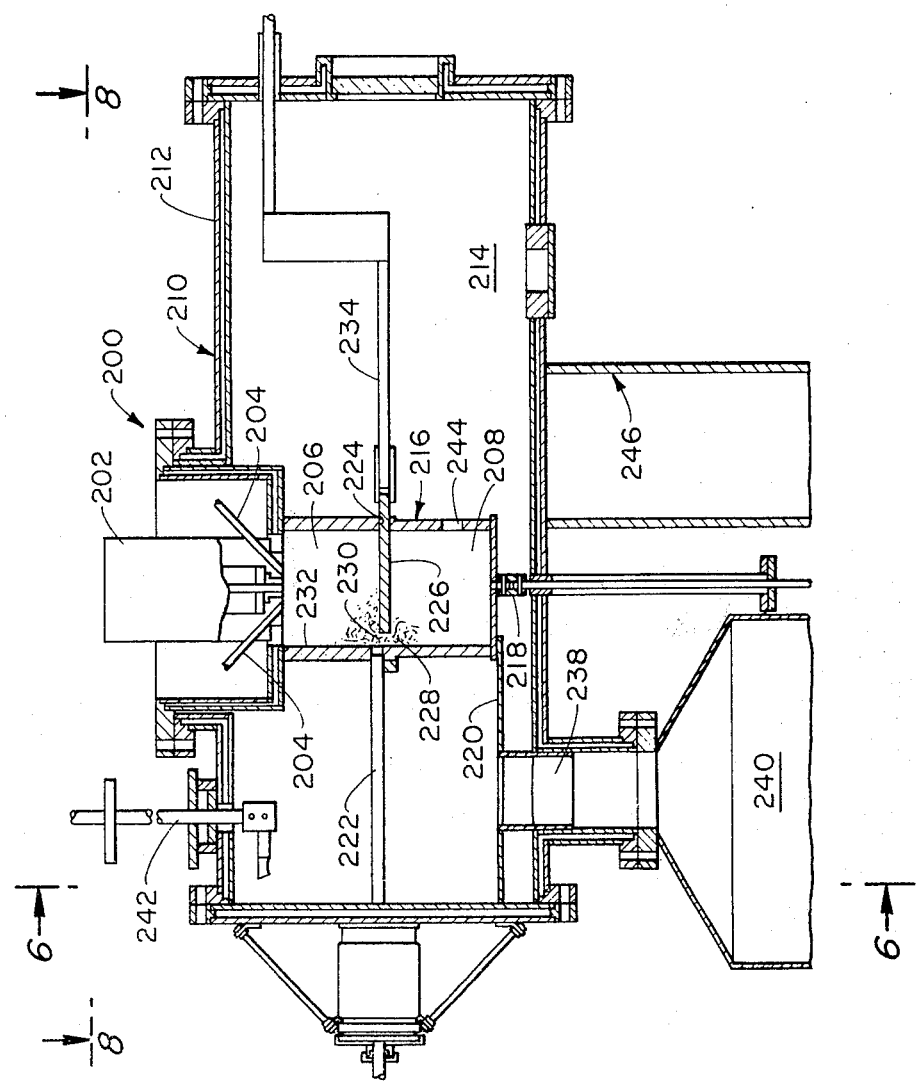

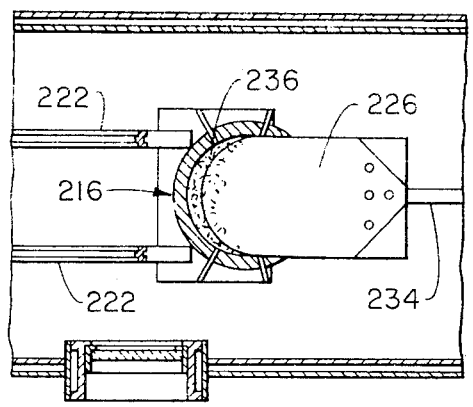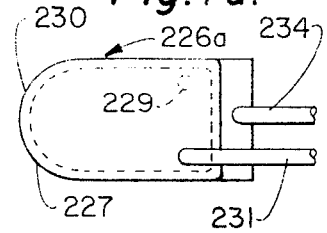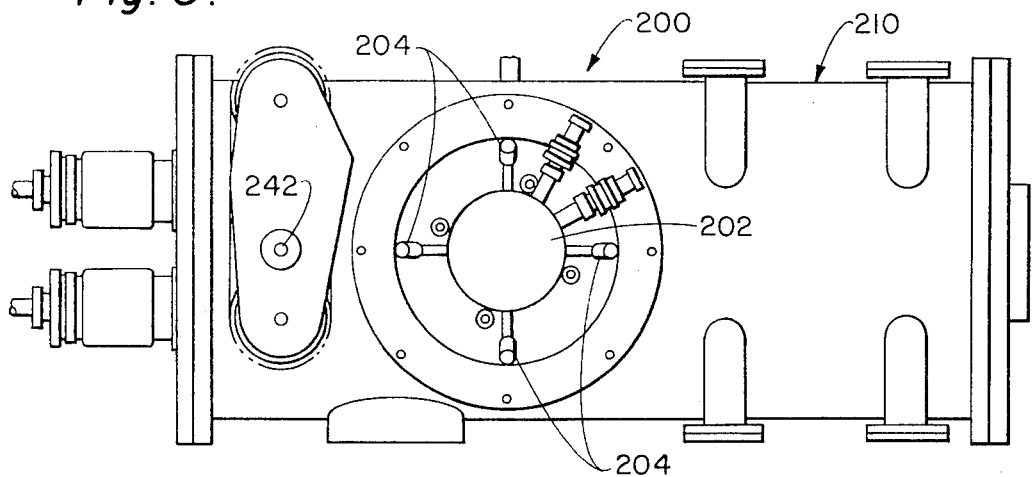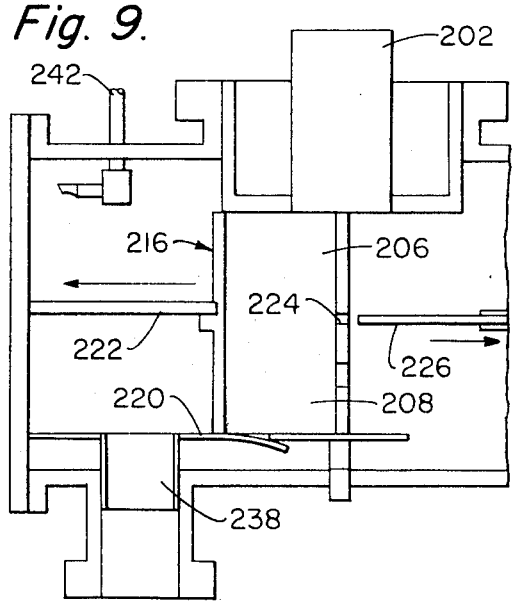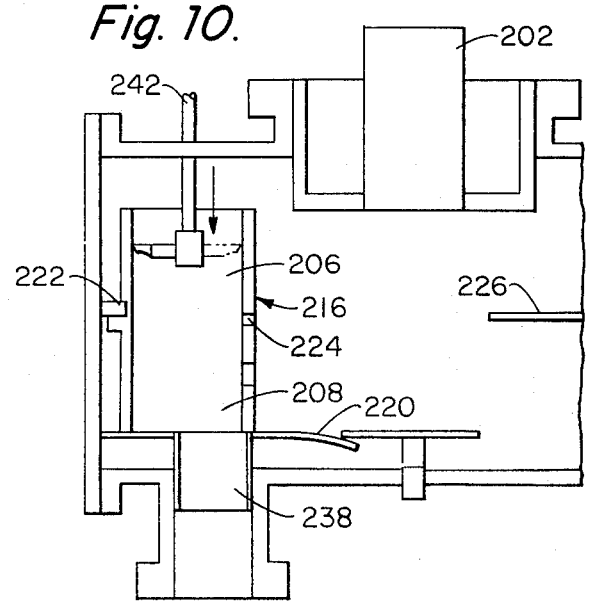

PLASMA METHOD AND APPARATUS FOR CARRYING OUT HIGH TEMPERATURE CHEMICAL REACTIONS

CROSS-REFERENCE TO RELATED APPLICATION

This is a divisional application of application Ser. No. 342,699 filed Mar. 19, 1973, now U.S. Pat. No. 3,840,750, which is a continuation-in-part application of application Ser. No. 303,707 filed Nov. 6, 1972, now abandoned, which is a division of application Ser. No. 125,589, filed Mar. 18, 1971, and now U.S. Pat. No. 3,738,824.

BACKGROUND OF THE INVENTION

This invention pertains to methods and apparatus for carrying out high temperature chemical reactions wherein high yields of reaction product is obtained. The invention is generally directed to reductions, halogenations and chemical synthesis reactions but is not limited thereto. Exemplary reduction reactions include reduction of refractory metal compounds to the elemental metal state. Refractory metals include, by way of example and not limitation, tantalum, tungsten, molybdenum and columbium. In some instances, formation of alloys of these metals with such other metals, such as tin, etc., is possible through simultaneous reduction of the constituents. Other applications of the invention include halogenation of various oxides, for example, columbium oxide to columbium chloride. The invention also pertains to the high temperature reaction or synthesis of chemicals, for example, the synthesis of acetylene, benzine and other hydrocarbons or products which are normally carried out under high temperatures.

More particularly, the invention relates to method and apparatus for producing relatively high purity reaction products of selected characteristics involving high percentages yields and selected characteristics, all in a commercially feasible manner.

More specifically the invention is directed to the processes and apparatuses for producing reaction products, as for example, metal powders, chemicals and halogenated metals using a plasma generator for the energy required to carry out the reaction.

For example, metallic halides and oxides are reduced, metal oxides halogenated and hydrocarbons and other compounds synthesized using a plasma generator to produce reaction products of the elemental metal, metal halides or chemical compounds and are recovered in relatively pure forms and in quantities which have not ben heretofore possible by plasma processes.

The prior art of gas-discharge physics is well aware of the means for conducting chemical reactions using a plasma flow or plasma jet. The chemical reactions with which this invention is involved are similar to those of the prior art but are specially directed to reductions of metallic compounds with reductants such as, for example, hydrogen or carbon; halogenations of metal oxides and hydrocarbon synthesis. Other reactions will readily suggest themselves to those of ordinary skill in the art as the disclosure proceeds herein.

The temperatures generated in a plasma generator are relatively high and the reactions carried out thereby have heretofore been primarily of a non-commercial nature, for a variety of reasons, some of the more common being because the plasma generators could not support sustained reactions without deleterious effects, for example, plugging of the anode chamber, or could only produce laboratory quantities of desired end products, which in most instances were not of a quantity or quality needed in commercial manufacturing processes, or because the product lacked certain essential characteristics, such as, for instance, size of the reaction product where reduction to elemental metals are concerned.

Among others, the present invention provides process and apparatus for the manufacture of elemental metals of the groups IVb, Vb, and VIb of the Periodic Table wherein a compound of said metals is reacted in a high temperature reaction zone produced by a plasma generator, in a manner to produce heretofore unavailable quantities of the elemental metal of selected particle size at a satisfactory purity level, or a halogen of said metal is produced which itself may be further reacted to obtain the metal per se.

For instance, a present commercial need exists for tantalum powder of substantially pure form and having a particle size sufficiently large for the formation of electrodes for capacitors, of the dry or liquid type. The elemental metal, such as tantalum, obtained in the practice of the herein disclosed invention is of capacitor grade quality from which capacitors may be formed. In other instances, a metallic oxide may be halogenated and further reduced to the elemental method according to the practice of the invention.

According to the invention hydrocarbons such as acetylene, benzine and other compounds requiring high reaction temperatures may be synthesized.

The following examples of the practice of the invention are illustrative. In the formation of elemental tantalum, a metallic halide such as tantalum pentachloride or potassium fluotantalate is reduced in the plasma reactor utilizing a reductant such as hydrogen, in a process wherein purity of the obtained tantalum is at a high level. The particle size of the metal is selectively controlled all in a commercially sustainable and feasible process producing copious amounts of the elemental metal at high percentage yields. In the formation of a metallic halide, an oxide such as columbium oxide may be chlorinated to columbium chloride. In the synthesis of chemical compounds acetylene is synthesized from methane.

OBJECTS AND SUMMARY OF THE INVENTION

It is an object of the present invention to provide a method and apparatus for carrying out high temperature chemical reactions.

It is another object of the invention to provide method and apparatus for obtaining usually high temperature produced reaction products of high purity in high yields.

It is still another object of this invention to provide method and apparatus for the production of elemental metal powders in a range of selected particle sizes, shapes and surface conditions, wherein the process may be continuous.

It is still a further object of this invention to provide method and apparatus for the production of elemental metals using a plasma generator.

It is still a further object of this invention to provide method and apparatus for the high temperature halogenation of oxides.

It is still a further object of the invention to provide method and apparatus for the high temperature synthesis of chemical compounds.

It is still another important object of this invention to recover high temperature reaction products using a plasma generator wherein selected fluid pressure control between a heated zone and a recovery zone is maintained to obtain the desired end product.

It is still a more specific and further object of this invention to provide a method and apparatus for reducing metallic compounds to the elemental metal compound form using a plasma generator.

It is still a more further specific object of this invention to provide method and apparatus for the reduction of metallic halides, oxides to the elemental metal.

It is still a further object of the invention to provide method and apparatus for the halogenation of metal oxides.

It is still another and further object of the invention to provide method and apparatus for the chlorination of at least two different metallic oxides.

It is a further specific object of the invention to provide method and apparatus for the chlorination of columbium oxide and the subsequent reduction thereof to elemental columbium.

It is still another further object of this invention to provide a method and apparatus for the reduction of one or more metallic halides using a plasma generator wherein the reactant is introduced into a reaction zone of the plasma generator and the elemental metal and/or alloy is collected in a collection zone of the apparatus.

It is still a more specific and further object of this invention to provide a method and apparatus for the production of elemental metal and/or alloy with a plasma generator wherein the effluent from the reaction zone flows through a collection zone wherein selective control of differential pressure and temperature between said zones permits particle formation of the metal in a selective manner.

It is still a more specific and further object of this invention to provide method and apparatus for forming refractory metal compounds for example, tantalum, tungsten, molybdenum and columbium compounds to the elemental metallic state wherein such metals are of high purity and of selected range of particle sizes on a continuous basis.

It is still an even further more specific object of this invention to provide a plasma process for high temperature chemical reactions wherein the reactant and/or reactants are introduced downstream of the anode or exhaust of said generator and the effluent flow from the generator is directed through a selectively variable passageway in a selectively controlled manner into a collector zone wherein reaction product is collected.

It is still a further and even more specific object of the invention to provide a method and apparatus for the high temperature synthesis, for example of acetylene, benzine and other hydrocarbons and chemicals in a hydrogen plasma process wherein the reactant is introduced downstream of the anode or exhaust of the generator and the effluent from the reaction zone is passed through a temperature gradient zone within which a collector is positioned to selectively vary the passageway for the effluent flowing through said temperature gradient zone.

Other objects and advantages of the invention will be apparent from the following specification and the accompanying drawings which are for the purposes of illustration only.

Basically, in an exemplary embodiment, the method of the invention comprises a process for reduction, halogenation or chemical synthesis wherein a reactant and/or reactants are introduced into a plasma, downstream from the anode or exhaust of the generator and the effluent flow from the reaction zone is directed through a selectively variable passageway, in a selectively controlled manner, into a collecting zone wherein reaction product, in relatively pure form and having a selected characteristic is obtained while maintaining selective control of the effluent flow.

One means of conducting the above process is through the use of a plasma generator apparatus comprising the combination of a reactor having a cathode and an anode within which a plasma arc is generated. Said generator communicates with a reaction zone member into which reactant feed material is introduced. A quench member comprising said reaction zone member directs the flow of effluent therefrom through a directed path and a collector means is positioned within the quench member and path, thereby forming a selectively variable passageway through which the effluent flows. By maintaining a selected pressure differential between the reaction zone and the collection zone, and by maintaining selected temperatures in the reaction zone and collection zone, a selected product of reaction is obtained from the effluent.

BRIEF DESCRIPTION OF THE DRAWINGS

FIG. 1 depicts a flow diagram for practice of one method of the invention;

FIG. 2 schematically illustrates an exemplary apparatus for the practice of the method disclosed in FIG. 1;

FIG. 3 is a fragmentary view of a plasma generator utilizing a specific embodiment of the invention;

FIG. 4 is a fragmentary view similar to the reactor shown in FIG. 3, but modified for practice of the invention on a continuous basis;

FIG. 5 is a simplified elevational view of another embodiment of the apparatus useful for the continuous production of reaction products, such as for example, elemental metals;

FIG. 6 is a view taken along the line 6—6 of FIG. 5;

FIG. 7 is a view taken along the line 7—7 of FIG. 6;

FIG. 7A is a schematic view of one of the alternative constructions of an element of the apparatus shown in FIG. 7;

FIG. 8 is a view taken along the line 8—8 of FIG. 5;

FIGS. 9 and 10 schematically illustrate the operation of the apparatus shown in FIG. 5;

DESCRIPTION OF THE BEST EMBODIMENTS CONTEMPLATED

Figure 11:
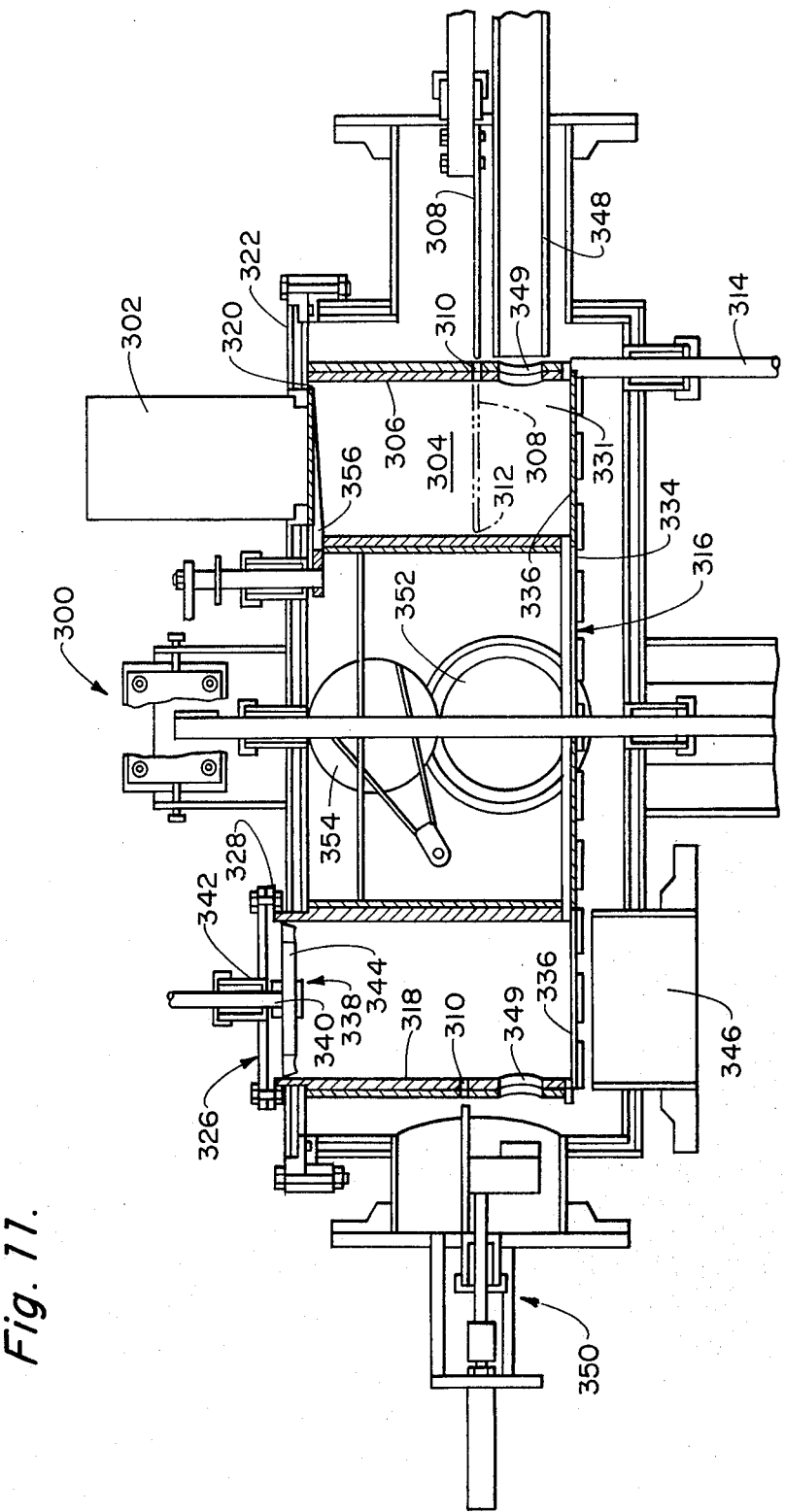
FIG. 11 is an elevational view, partially in section, showing an apparatus for continuous practice of the invention.

As an introduction, a brief general description of the inventive method and apparatus will be beneficial in understanding the scope and breadth of the invention.

Referring to FIGS. 1 and 2, one specific method of the invention process and exemplary apparatus for practicing the process are illustrated. It should be understood that the specific process described is for illustrative purposes only. Thus, while the invention will be described for the reduction of metal halides, it is also applicable to the halogenation of metal oxides and the high temperature synthesis of chemicals, as will more fully appear hereinafter.

The plasma generator 2 is generally of the conventional type having the usual cathode and anode suitably connected to a power supply so that a potential across the anode zone 4 is produced. The introduction of a stabilizer or inert gas or alternatively, of a reactant gas, into the anode zone 4 produces a reactive plasma generally within anode zone 4 extending axially downward in direction of the arrow shown in FIG. 2.

Thus far, the plasma generator described is wholly or prior art type. Feed material, comprising a refractory metal compound and from which elemental metal is to be obtained, is fed via inlet 6 by itself (or in some instances with a feeder or carrier gas, as will become apparent) so that the feed material is introduced downstream of the anode and approximately into the generated plasma. Feeding the feed material in this manner effectively prevents reaction product buildup on the interior anode surfaces.

Where a stabilizer gas is used to generate the plasma, the carrier gas for the feed material may also comprise a reactant gas such as hydrogen, where the refractory metal compound is to be reduced, and/or a reactant gas may be introduced adjacent the point of feed material introduction as by means of reactant gas inlet 8. The feed material and reactant gas are carried by the plasma into what may be considered an axially extending reaction member 10. Member 10 is made of a material which is preferably inert to the reactants and reaction conditions (one such material being tungsten). Other refractory metals will also suffice and will be chosen for their ability to withstand the high temperatures involved; will not suffer erosion and will not contaminate the elemental metal sought to be recovered.

The member 10 generally defines the principal reaction zone 12 from which effluent flows through the lower portion 14 of member 10 and into a collector means generally designated 16 and through an outlet 18 provided in the wall of quench member 20.

As illustrated, the reaction zone 12 and a collector zone 22 are located within the confines of quench member 20 of a fluid-cooled type. Collector means 15 comprises, in this instance, a cylindrical, sleeve-like member 24 also of an inert material, the wall thereof extending upwards, into substantially fluid-tight engagement with horizontal portion 15 of the outwardly flared wall 14 of member 10. Disposed within sleeve 24 generally defining collection zone 22 is the other portion of collector means 16, collector cup member 26 having a peripheral edge 25. It will be noted that a temperature gradient is established between the elongate upper portion of member 10 and the flared wall portions 14 thereof.

Collector cup 26 is generally of cup configuration having a major peripheral configuration coinciding with the flared wall portions 14 of member 10. A support member 28 is secured to the bottom of collector cup member 26 and extends through an aperture 30 provided in the bottom wall of quench member 20 in a manner that allows axial movement of collector cup 26 in the direction of the arrow, substantially through the entire length of sleeve 24. Theoretically, member 10, in combination with the interior surface of collector cup member 26, generally defines the boundaries of reaction zone 12, although the principal reaction of the reactants take place upstream of the collector cup member 26.

For obvious reasons, the materials of construction of the member 10, at least the interior of sleeve 24, cup member 26 and support member 28, are fabricated of materials inert to the reaction conditions, reactants and resultant elemental metal.

In practice of the method using the apparatus schematically illustrated, a gap between the horizontal wall portion 15 and the edge 25 of cup member 26 forms a passageway 32 which is selectively variable to control the effluent flowing from reaction zone 12 through the outlet 18. The passageway 32 because of the axial movement of collector cup 26 may be selectively varied for purposes which will be described and become apparent.

An initiation of the process, the cup member 26 is positioned so that the passageway 32 is a small one from about 0.0312 to 0.500 inch, with an initial spacing of about .1250 generally being sufficient. After a period of time, elemental metal from the effluent flowing through the passageway 32 and in the manner shown by the arrows, begins to build up in sponge form on and about the edge 25 and grows to the outer extremities thereof to the interior wall of sleeve 24 substantially as shown. The sponge is initially donut-shaped and because of its position, impedes the flow of effluent through passageway 32 but performs a beneficial function in that the effluent when flowing through the interstices of the sponge deposits still more metal particles allowing for greater recovery.

Periodically, the support member 28 is moved axially downward to maintain the passageway 32 sufficiently large to allow passage of the effluent and to allow further buildup of the metallic sponge, the height or depth of which will extend substantially the entire length of sleeve 24 to thereby produce what may be considered a metallic sponge elongate donut of irregular cylindrical shape.

At the completion of the run, the collector 16 may be removed from the confines of quench member 20 and the elemental metal scraped off of the interior of the sleeve 24 and the surfaces of collector cup 26. The recovered elemental metal is of high purity and of unique characteristic having an apparent Fisher Sub sieve particle size within the range of from about 0.5 to 12 microns, and larger, depending upon the conditions under which the collection is carried out. Generally, particle sizes within the one to ten micron range will be formed. As will be more fully set forth hereinafter, the particle size of the recovered metal may be selectively controlled by varying the size of the passageway 32 through which the effluent of the plasma reactor passes.

In some instances, it will be desirable to produce sub-micron metal particles. The flow-through or waste effluent is withdrawn from the system through outlet 18 and may be passed into suitable heat exchangers, separators or other conventional recovery equipment.

The plasma generator should be adjusted to obtain a neutral gas temperature in the plasma reactor sufficiently high (1800° K to 5000° K) to obtain the desired chemical reaction. As a rule, the reaction is carried out under atmospheric pressure or slightly above.

Various gases may be used to stabilize the plasma, such as inert gases as for instance, helium or argon, or reactive gases as for instance, hydrogen, nitrogen or methane. The type of stabilizer gas used to generate the plasma and the power input to the generator will necessarily dictate the temperatures generated thereby.

The power input into a plasma generator will for the most part determine the intensity of the reaction generated in the plasma stream and may be varied, keeping in mind the aforementioned criteria.

In order to obtain proper mixing and to carry the feed material into the reaction zone, a carrier or feeder gas may be found to be desirable. The feeder gas may be one of the stabilizer gasses mentioned above or may be a reactant such as hydrogen where reduction of a metallic compound is contemplated. Thus, in some instances, one of the reactants such as hydrogen may be used to generate the plasma stream and also to carry the feed material into the reactor. This will be found to be desirable when considering that high yields using the method of the invention are obtained by having excess stoichiometric amounts of hydrogen available for the reduction.

Ease of conversion and the amount of conversion, where it is desired to reduce a refractory metal compound for example, such as tantalum pentachloride, to tantalum by reduction with hydrogen gas, are dependent on the excess hydrogen ratio over the stoichiometric amount required to obtain substantially complete conversion of the tantalum pentachloride to tantalum metal. Desirably excess hydrogen ratios are employed which provide substantially complete conversion at the particular reduction temperatures and pressures employed. A hydrogen excess of about 3 to 5 at a calculated temperature range of about 1800° K to 3000° K will permit substantially complete version.

Where it is desired to introduce the feeder material in the vaporized state with a carrier gas, preheating of the carrier gas may be necessary in order to feed material in the vaporized state. It has been found, however in most instances that vaporization and/or preheating of feed material or the carrier gas is not necessary.

In most cases in the production of elemental metals, the reactant feed material will be a refractory metal compound from which the elemental metal is sought to be recovered. Thus examples of elemental metals which will be recovered generally include those previously mentioned and more specifically tantalum, molybdenum, tungsten and columbium or niobium. The halides of these metals as well as oxides are also suitable and will include such exemplary compounds as tantalum pentachloride, columbium pentachloride, tungsten pentachloride and molybdenum pentachloride. Generally, any of the compounds wherein the chemistry is generally known and has heretofore been demonstrated in the art will suffice in the practice of the invention. Hence, reduction to the elemental metals using carbon, sodium or other additives are also contemplated.

The purity of the elemental metal produced by the process of the invention is dependent to a great extent on the purity of the reactants, i.e. refractory metal compounds and the other reactants such as a reductant, for example hydrogen. Also playing an important role are the materials comprising the reactor and the apparatus in which the process is practiced. Thus, materials commonly used for high temperature applications and which are substantially chemically inert and resistant to the reactants at the particular process conditions with the particular feed material being used, will be found to be desirable.

Desirably, the reactor and collector portions of the apparatus will be fabricated of or lined with the elemental metals sought to be recovered or one of the other commonly and commercially available refractory metals such as for example, tungsten. To insure high purity, the apparatus may be cleansed with an inert purge gas such as argon or helium, prior to commencing the practice of the method of the invention. These matters as well as others are generally well known in the metallurgy art and need not be delved into in great detail herein.

Referring now to FIG. 3, a specific apparatus and method of carrying out one embodiment of the invention will be described. A reactor of the conventional type having the usual reactor head 42 (only the anode portion of which is illustrated). Anode structure 44 is appropriately water cooled and is positioned in axial alignment with feed collar member 46 also appropriately water cooled by means of water inlet 48 and appropriate water lines not shown. Collar 46 is annular in configuration and is provided with an inner liner 50 of an inert material. Feed material may be introduced by means of a plurality of lines or one feed line 52 through feed collar 46. The introduction of additional reductant, or the like through lines, not shown, may also be provided. The primary stabilizer gas and reductant inlets are provided in the reactor head 42 above the anode structure 44 and are not shown herein.

Positioned below anode structure 44 is quench fixture or tank 54 of the water-cooled type being provided with water inlet 56 and water outlet 58 so that cooling fluid may circulate in conventional fashion. A viewpoint 60 may be provided in the wall of quench tank 54. Other viewports located generally at 62, not shown, may also be provided so as to be able to view the interior of the quench member 54. Quench tank 54 is secured to reactor head 42 in fluid-tight relationship by means of a header 64 in conventional fashion and is provided with bottom wall 66 having removable cover 68 which is provided with through hole 70 for purposes which will be described. Effluent outlet 71 is provided in the side wall of quench member 54.

Positioned downstream of anode structure 44 and collar 46 is a reaction zone member, generally designated 72, comprising throat member 74 having an upper flanged portion 76 supported by means of support collar 78 provided for that purpose. Secured to the lower end of throat 74 of member 72 is cup member 80 of bell-like configuration disposed about throat 74 so that the terminus portion 82 of throat 74 extends well into the interior of cup 80. Cup 80 is here shown as supported by plate 84. Plate 84 is provided with a central opening 86 congruent in size and shape with the inside peripheral edge of cup member 80.

Plate 84 is supported from the interior wall 88 of quench tank 54 by means of ring support 90 which is welded or otherwise secured to interior surface 88.

Positioned within the interior of quench tank 54 and below plate 84 is liner 92 comprising a tubular sleeve having carbon wall 94 and inner lining 96 of an inert material. Liner 92 may be supported by bottom support ring 98 in the manner shown.

Disposed within the confines of liner 92 is collector cup member 100 of general cup configuration having a flanged edge 102 and being supported from the bottom thereof by means of rod 104 secured by means of bushing and pin assembly 106. Rod 104 extends through bore 70 in removable cover plate 68 and supports cup member 100 in an axially shiftable manner so that cup 100 may be moved toward and away from plate 84 in an axial direction substantially the entire length of liner 92. It will be noted that the surface of plate 84 inwardly directed toward cup 100 forms with the outer surface 108 of lip 102 a passageway or orifice generally designated 110.

The throat 74, bell-like member 80, plate member 84, collector 100, rod 104, bushing and pin assembly 106, as well as inner lining 96, are preferably made of a refractory material and one that is inert to the reaction conditions which are to be carried out in the reactor 40 and which will not erode under the high temperature, and high fluid flow conditions. In the preferred case, tungsten is a suitable material but other materials such as molybdenum and the like will also suffice.

The throat member 74, bell-like member 80 and collector cup 100 generally define a high temperature or reaction zone 112 wherein a refractory metallic compound, for example, is reduced by a reductant such as hydrogen. Theoretically, most of the chemical activity takes place within the throat member 74. However, because of the turbulent conditions within the zone defined by members 74, 80 and 100 reaction may take place throughout. The collector 100 in conjunction with plate 84 and inner lining 96 form what may by considered a collection zone 114 generally within the area of the orifice or effluent passageway 110.

In practice, the reactor 42 is energized to produce a plasma generally in the area designated 116 proximate to the feeder material inlet (or inlets) 52. So that ease of viewing may be had through the viewports, and generally positioned at 62, not shown, a gas such as hydrogen may be injected at these port sites so as to keep the ports sufficiently cooled to permit visual observations of the interior of quench tank 54 above and below plate 84. As feed material is introduced directly into the plasma for example, a feed material such as tantalum pentachloride, which is carried by a carrier gas such as argon, chemical reaction because of available reductant and extremely high temperature takes place within zone defined by members 74, 80 and 100 but theoretically predominantly within the confines of throat member 74.

An effluent from and within the reaction zone comprising vaporized elemental tantalum, hydrogen, hydrogen chloride from the reducing reaction, as well as unreacted tantalum pentachloride and argon, flows downward from the confines of throat 74, through a temperature gradient, into bell member 80 whereat because of the substantial pressure and temperature difference, a deposition of elemental tantalulm begins to occur. The effluent passes through the passageway 110 through the length of the liner 92 and thence out through the outlet 71 of the quench tank for further treatment and/or recovery processing.

As the reaction is initiated, the collector cup 100 is positioned relative to the interior surface of plate 84 so as to provide a gap distance of about one eighth inch between the interior surface 108 (FIG. 3) of edge 102 and the interior surface of plate 84. As the effluent follows the path heretofore described, elemental tantalum begins to form predominantly on the interior surface 108 of edge 102 in significant quantities. After a time, tantalum sponge is formed tending to completely block the gap or passageway 110 and hinder effluent flow to the extent that increasing back pressure begins to develop within reaction zone. When this occurs, the collector cup 100 is moved axially downwards (manually or otherwise) by means of rod 104 so as to maintain a pressure differential between reaction zone and the interior of liner member 92 or collection zone 114 of about 0.5 to 5.0 psig with a preferred range being about 2 to 3 psig. Obviously, instrumentation, not shown, is provided for this purpose. As the tantalum sponge begins to form and grow, more and more elemental tantalum is recovered in that the effluent must now also pass through the interstices of the porous sponge of elemental metal to thereby deposit more elemental metal therein and thereon.

In the apparatus depicted in FIG. 3 continuation of the process is carried on until the collector cup 100 is at or near the lowermost edge of liner 92 at which time the apparatus is shut down, allowed to cool and the tantalum removed. The recovered tantalum is found to have a particle size range considerably larger than the sub-micron particles heretofore recovered in the prior art and is recovered in copious quantities at overall yields of sponge in excess of 90% and at high purity levels. The refractory and other metals also exhibit unique physical properties heretofore unobserved in elemental metal production processes.

Referring now to FIG. 4, a similar type apparatus as that depicted in FIG. 3 is schematically illustrated but differs therefrom in the respect that whereas the apparatus described in FIG. 3 only permitted batchwise refractory metal production, the apparatus depicted in FIG. 4 permits refractory metal recovery on a continuous basis.

The apparatus of FIG. 4 is essentially of the same construction as the apparatus of FIG. 3 except as will be explained. The plasma generator head has been omitted since this structure is essentially the same as shown in FIG. 3. It will be noted in this instance, that throat member 142 is slightly shorter than that previously described and upper cup member 144 is of slightly different shape than the bell-like member 80 in the previously described apparatus. A shortened formation zone for the metallic sponge is achieved by providing a shortened liner 146 adequately supported from the interior walls of the quench tank as by means of supports 148 and 150.

A collector 152 is of generally more cylindrical shape than the collector 100 previously described.

Once the elemental metal has deposited in the form of a sponge (donut shaped or porous cylinder, shown on the exterior of collector 152 positioned in the phantom position) substantially the length of the liner 146, the collector 152 is moved to the phantom line position shown and a plurality or rods 156 are brought into the relative positions shown. When the collector 152 is moved upwards back into the full line position shown, the rods engage the sponge donut breaking it free or scraping it from collector 152 allowing it to fall to the bottom of the quench tank whereat is positioned a leg-supported receptacle or dish 158 which receives the dislodged metal sponge.

Thus, there is no need to cool down the reactor 140 each time the donut sponge formation is formed, and the only limitation to continuous operation of reactor 140 is the capacity of receptacle or catcher pan 158. However, and as is obvious to those of ordinary skill in the art, an automatic conveyor, rake or any such means may be employed for removing both the pan 158 and the accumulated elemental metal contained therein from the bottom of the quench tank without difficulty.

As was the case in the apparatus depicted in FIG. 3, the rods 156 and the pan 158 are of inert materials such as for example, tungsten, so as not to contaminate the elemental metal recovered. The mode of operation of the device 140 is essentially the same as that described for the device with the exception hereinbefore noted.

A plasma generator was constructed according to principles well known to the state of the art and was positioned in axial alignment with a feeder ring plate or member such as 46 of stainless steel material and having four feeder material inlets angularly disposed as shown in FIG. 3.

Supported on the graphite spacer 78 was a throat member 74 of tungsten having an inside diameter of 2.1875 inches, a wall thickness of 0.0937 inch and a length of about 3.25 inches.

A tungsten bell member 80 having an inside diameter of approximately 4.500 inches and being about 3.25 inches long with a 0.125 inch wall thickness was positioned as shown in FIG. 3 with the lower extremity of throat 74 projecting about 1.5 inches into the bell member 80.

Bell member 80 was supported on plate member 84 being of tungsten material 0.125 inch thick, and a diameter of 11.500 inches with a central aperture of 4.500 inches opening into the interior of bell member 80. Plate 84 was supported within the quench member 54 by a stainless steel ring 90, ¼ × ½ inch, tack welded to the inner wall of quench tank 54.

The liner 92 comprised graphite sleeve 94 of 0.375 inch wall thickness and was approximately 6.3750 inches in diameter, with an approximate length of about 12 inches. An interior surface 96 of tungsten approximately 0.020 inch thick completed the interior of the liner member 92. Member 92 was supported by a stainless steel ring such as 98 and as shown in FIG. 3.

The collector cup or member 100 comprised a cup of approximately 4.500 inches inside diameter, a length of 4.0 inches, and was fabricated of tungsten having a wall thickness of 0.125 inch. The support rod 104 was a 0.3750 inch diameter tungsten shaft secured to cup 100 by means of tungsten bushing and tungsten pin assembly 106 substantially as shown in the figure. The outlet passageway 71 from quench tank 54 through which effluent flowed, was about 1.0 inch in diameter.

Using an apparatus as immediately described above, a series of experimental runs was conducted wherein the effluent passageway 110 was varied from about ⅛ to ¼ inch to vary the differential pressure between reaction zone generally indicated at 112 and the collection zone 114 within the interior of the linear member 92. This procedure also affected temperature conditions within reaction zone 112. By varying the passageway 110, larger or smaller elemental metal particles were selectively obtained by means of forming a metallic sponge cylinder or donut approximately 15 centimeters in diameter, 2 centimeters thick and a length which varied depending upon the length of each run.

Average temperature conditions in the reaction zone 112 were calculated to be within the range of about 1,800°–2,850° K and the temperature of the flow through or waste effluent was measured to be within the range 200°–550° C. From the quench tank outlet 71 the effluent was put through a cyclone recovering apparatus of conventional type to obtain additional elemental metals of sub-micron size.

The in situ formed elemental metal sponge was found to have individual particles exhibiting a necking property to produce inter-connected particles forming a porous structure and which upon grinding and sieving produced elemental particles or powder of the one to ten micron size determined by gas permeability using the Fisher sub-sieve sizer technique. The unique configuration of the metallic sponge was ascertainable by means of photomicrographs clearly indicating the unique structural characteristics of the elemental metals obtained in the practice of the herein-disclosed invention. The photomicrographs also revealed the porous structure in detail. Thus revealing how the effluent gas could continue to flow through the sponge.

Analysis of the various metals obtained indicated that refractory metals of extremely high purity levels were obtained. In order to verify in several of the instances what material was being collected in the metallic sponge form, samples were determined to exhibit X-ray diffraction patterns identified as molybdenum, tantalum and tungsten respectively, having a cubic or crystaline structure.

As indicated, using the reactor already described, a series of runs was made to obtain elemental tantalum. The feed material was tantalum pentachloride and the results are accurately depicted in the following Table I, Table II, and Table III.

TABLE I

| | POWER | | | | GAS | | |
|---|---|---|---|---|---|---|---|
| Run No. | KW (Gross) | KW (Net) | Head Eff'y % | Cal. Reaction °K | H₂ Stab. Flow, SCFH | Feed Carrier Flow, SCFH | Feed Rate Contained Ta Lb/Hr. |
| A. | 76.6 | 26.6 | 37.7 | 2870 | 663 | 148 (He) | 32.6 |
| B. | 71.4 | 26.7 | 37.4 | 2956 | 663 | 178 (He) | 17.3 |
| C. | 63.0 | 26.5 | 42.0 | 2600 | 800 | 266 (He) | 21.8 |
| D. | 65.3 | 40.6 | 62.2 | 2980 | 883 | 198 (Ar) | 43.4 |
| E. | 62.2 | 35.4 | 56.6 | 2825 | 883 | 198 (Ar) | 12.5 |
| F. | 65.2 | 37.8 | 58.0 | 2850 | 883 | 198 (Ar) | 18.3 |
| G. | 66.4 | 37.8 | 57.0 | 2886 | 883 | 198 (Ar) | 23.6 |
| H. | 65.8 | 37.0 | 56.3 | 2865 | 883 | 198 (Ar) | 21.8 |
| I. | 64.8 | 30.5 | 47.0 | 2800 | 773 | 198 (Ar) | 16.7 |
| J. | 64.5 | 36.1 | 55.8 | 2842 | 883 | 198 (Ar) | 21.2 |
| K. | 61.8 | 34.7 | 56.1 | 2800 | 833 | 198 (Ar) | 21.1 |
| L* | 65.0 | 37.2 | 57.2 | 2856 | 883 | 198 (Ar) | 24.0 |
| M* | 61.6 | 36.4 | 51.5 | 2710 | 883 | 198 (Ar) | 24.3 |
| N* | 64.4 | 34.2 | 53.1 | 2800 | 883 | 198 (Ar) | 22.0 |

*¼" tungsten rods placed in effluent flow below collector cup.
(t) - Overall total conversion including fines ranges from 62.0% – 98.2%
FEED AND RECOVERY

| Feed Time Hours | Total Contained Ta Pounds | Ta Sponge Pounds | Ta Fines, Pounds | % of total (t) conversion recovered in sponge form |
|---|---|---|---|---|

TABLE I-continued

| | POWER | | | | GAS | | |
|---|---|---|---|---|---|---|---|
| Run No. | KW (Gross) | KW (Net) | Head Eff'y % | Cal. Reaction °K | H₂ Stab. Flow, SCFH | Feed Carrier Flow, SCFH | Feed Rate Contained Ta Lb/Hr. |
| | 0.47 | 7.74 | 6.67 | | 1.07 | | 86.2 |
| | 0.75 | 6.59 | 4.15 | | 1.88 | | 63.0 |
| | 0.67 | 7.41 | 4.13 | | 3.34 | | 56.0 |
| | 0.21 | 4.52 | 1.98 | | 0.84 | | 44.0 |
| | 0.48 | 4.06 | 2.97 | | 0.71 | | 73.2 |
| | 0.48 | 4.43 | 3.55 | | 0.48 | | 80.3 |
| | 0.28 | 3.41 | 2.72 | | 0.29 | | 80.3 |
| | 0.37 | 4.08 | 2.51 | | 1.14 | | 61.6 |
| | 0.36 | 4.12 | 1.75 | | 1.86 | | 47.8 |
| | 0.35 | 3.76 | 3.09 | | 0.73 | | 83.5 |
| | 0.34 | 3.67 | 2.89 | | 0.41 | | 78.4 |
| | 0.37 | 4.58 | 3.96 | | 0.38 | | 86.5 |
| | 0.40 | 4.88 | 4.19 | | 0.59 | | 86.0 |
| | 0.42 | 4.73 | 3.93 | | 1.03 | | 83.0 |

TABLE II

AVERAGE CONDITIONS PER RUN

| Ta in Feed Runs | Lbs. Total | Lbs/Hr. | Sponge Lbs Total | Lb/Hr | % of Feed | Fines Lbs Total | Lb/Hr | % of Feed |
|---|---|---|---|---|---|---|---|---|
| F thru N | 4.2 | 10.87 | 3.16 | 8.23 | 76.1 | 0.76 | 1.97 | 18.0 |
| L thru N | 4.73 | 12.12 | 4.03 | 10.33 | 85.0 | 0.67 | 1.70 | 14.1 |

| Power | | | | SCFH Gas | | |
|---|---|---|---|---|---|---|
| KW Gross | KW Net | Eff. % | Cal React. Temp. | H₂ Stab. | H₂ Stoich. Multiple | Feed Carrier |
| 64.2 | 35.7 | 55.0 | 2823 | 883 | 15.22 | 198 (Argon) |
| 63.7 | 35.9 | 56.4 | 2889 | 883 | 13.6 | 198 (Argon) |

TABLE III

FISCHER SUB SIEVE Analysis

| Runs J & K | −200 Mesh | Run M +200 | −100 Mesh |
|---|---|---|---|
| Porosity Setting | Microns | Porosity Setting | Microns |
| .80 | 1.95 | .75 | 8.40 |
| .75 | 1.50 | .70 | 6.40 |
| .70 | 1.83 | .65 | 6.40 |
| .65 | 2.04 | | |
| .62 | 1.90 | | |

| Run L | −200 Mesh | Run N +200 | −100 Mesh |
|---|---|---|---|
| Porosity Setting | Microns | Porosity Setting | Microns |
| .80 | 0.90 | .80 | 7 |
| .75 | 1.10 | .75 | 8 |
| .70 | 1.30 | .70 | 6.8 |
| .65 | 1.48 | .65 | 5.9 |
| .62 (1.60) | 1.45 | .60 | 5.3 |

| Run M | −200 Mesh | Run M +200 −200 | 50/50 |
|---|---|---|---|
| Porosity Setting | Microns | Porosity Setting | Microns |
| .80 | 1.15 | .80 | 7.20 |
| .75 | 1.25 | .75 | 5.20 |
| .70 | 1.55 | .70 | 3.05 |
| .65 | 1.51 | .65 | 2.45 |
| .62 | 1.65 | .62 | 2.35 |
| | | .62 | 2.35 |

| Run N | −200 Mesh | Run N +200 −200 | 50/50 |
|---|---|---|---|
| Porosity Setting | Microns | Porosity Setting | Microns |
| .80 | 8.4 | .80 | 4.95 |
| .75 | 1.92 | .75 | 4.2 |
| .70 | 2.30 | .725 | 3.95 |
| .65 | 2.21 | .70 | 3.05 |
| .62 | 2.2 | .675 | 2.80 |
| | | .650 | 2.80 |
| | | .625 | 2.80 |
| | | .60 | 2.80 |

TABLE III-continued

FISCHER SUB SIEVE Analysis

| Runs J & K | −200 Mesh | Run M +200 | −100 Mesh |
|---|---|---|---|
| | | .575 | .285 |

Tantalum powder produced and recovered as heretofore described was subjected to analysis to determine the purity thereof. Results of the analysis are accurately depicted in Table IV below in parts per million.

TABLE IV

| Impurity | PPM |
|---|---|
| Nb | 30 |
| Mo | 10 |
| Fe | 16 |
| Cr | 3 |
| Ni | 3 |
| Mn | 1 |
| Co | 5 |
| V | 3 |
| Ti | 10 |
| Zr | 10 |
| Cu | 1 |
| Sn | 3 |
| Bi | 1 |
| Pb | 3 |
| Ca | 10 |
| Mg | 1 |
| Al | 1 |
| Si | 10 |
| O₂ | 1400 |
| H₂ | 1000 |
| N₂ | 1400 |
| Cl | 1600 |
| C | 110 |

Tests were conducted of electrical properties of capacitor anodes made from tantalum powder produced from the practice of the invention. A commonly accepted criterion of quality of capacitor anodes is the product of the capacitance and test voltage per unit weight of anode material. The tests indicate that the CV product per gram is comparable to powders in commercial use.

Anodes sintered at 1900° C gave CV/g values in the approximate range 2900–3360 and with a 2000° sinter, 2400–2600. At a sintering temperature of 1800°, CV/g of approximately 4000–5100 were found.

The DC leakage current was one-quarter to one-half microampere in anodes sintered at 2000°.

Using the apparatus depicted in FIG. 4, several runs were conducted to test the efficacy of the method and device in the continuous production of elemental refractory metals. The feed material consisted of columbium pentachloride fluidized with argon carrier gas. The reductant consisted of hydrogen.

After a period of running time a metallic sponge formed on the collector cup 152. The cup was lowered and rods 156 inwardly positioned to rake off the formation product when the cup 152 was moved back into its initial position. Formation product dropped into the receptacle 158. This procedure was repeated and the test then terminated.

The formation product was subjected to analysis and determined to be columbium. Of total theoretical recovery, 81.5% of the columbium was recovered in the sponge donut form, while 17.8% of the metal was additionally recovered for a total overall recovery of 99.3%. Spectographic analysis indicated that the columbium was of pure form as follows:

| Impurity | | Wt. % |
|---|---|---|
| Si | | .006 |
| Mm | | trace |
| Fe | | trace |
| Mg | | trace |
| Ca | | trace |
| Al | | .02 |
| Cu | | .05 |
| Ti | | .08 |
| | Wet Analysis | |
| Cl | | .05% |
| $O_2$ | | .150 |

The efficacy of the apparatus and method of the invention, as well as the range of applicable chemical reactions, was demonstrated by several experimental runs accurately tabulated in Table V.

without the need of shutting down the plasma reactor is shown.

The apparatus 200 employs a typical plasma generator head 202 having feed inlets 204 communicating to a reaction zone 206 with a quench or collection zone 208 therebelow.

An encompassing chamber 210 having water circulation paths 212 through which water or other cooling medium is circulated forms a chamber 214 within which the reaction zone 206 and collection 208 formed by tungsten lined member 216 is contained. The member 216 is supported by vertical support member 218 but is mounted for reciprocal movement (as seen in FIGS. 9 and 10) upon the support plate 220. The member 216 is provided with moving handle or means 222 by which the member 216 may be moved to the far left position as seen in FIG. 5 and as schematically illustrated in FIG. 9.

The member 216 in this instance, is of cylindrical configuration and is provided with opening 224 into which projects blade member 226 which is reciprocally mounted for varying a gap 228 formed between the edge 230 of blade 226 and the interior wall 232 of member 216.

Blade member 226 in this instance, may be of graphite and provides the means whereby a pressure differential and temperature gradient is obtained between reaction zone 206 and collection zone 208. The blade member 226 is also connected to manipulating means 234 which permits the wide variety of lateral adjustments (as seen in FIG. 5) so that the practice of the invention, whether it be for reduction, chlorination or synthesis will provide the means whereby a desired end product is obtained. In some instances, the blade member 226 may be of an inert metal, i.e., tungsten or the like, and may be itself water cooled as seen in FIG. 7A.

The blade member 226a, as seen in FIG. 7A is of somewhat rectangular configuration having an edge or end portion 230 of the same radius as the radius of the member 216 so as to form a crescent shape gap 236 best seen in FIG. 7. The blade member 226a is provided with a water or other coolant passageway 227 having appropriate cooling source connections wherein the coolant is introduced through inlet 229 and circulated through outlet conduit 231. The cooling feature of the blade 226a aids in collection of the desired end product.

Referring again to the remaining figures of drawings, it will be seen that the chamber 210 is provided with an opening 238 into a product collection member 240.

TABLE V.

| | Head Eff'y | $H_2$ Stab. Flow, SCFH | Feed Carrier Flow, SCFH | Feed | Sponge Metal Recovd. | % of theoretical |
|---|---|---|---|---|---|---|
| Run No. 1 | 26 | 595 | 47 (Ar) | $WO_3$ | 246 g. | 40.7 |
| Run No. 2 | 56.6 | 883 | 198 (Ar) | $(NH_4)_6Mo_7O_{24} \cdot 4H_2O$ | 2487g. | 86 |
| Run No. 9 | 66.7 | 883 | 198 (Ar) | $(NH_4)_{10}W_{12}O_{41} \cdot 5H_2O$ | 4335g. | 90.3 |

Referring now to FIGS. 5–10 inclusive of yet another apparatus is shown wherein the practice of the method of the invention whether it be for the reduction of metallic salts, the chlorination of metallic oxides, the formation of metal alloys or the high temperature synthesis of chemical compounds on a continuous basis Projecting into the chamber 214 and disposed above the collector 240, is a rotatable auger 242 which provides for ease of collection of the product, for example, the elemental metals where the process carried out is the formation of same.

The member 216 is provided with effluent outlet 244 which communicates to a cyclone collector member, not shown, through conduit member 246. Other specifics of the construction of the chamber member 210 are not important and form no part of the invention except as is necessary to carry out practice of the invention and employs the type of plasma reactor head as previously disclosed and generally operates under the same parameters as set forth for the FIGS. 3 and 4 apparatuses using essentially the same method except as will now be described.

In the utilization of the apparatus 200, a passage of reaction time permits the formation of, for example, tantalum sponge metal on the blade member 226, particularly in the gap area 228 as shown in FIG. 5. Whereas, the apparatus of FIG. 3 would have to be shut down in order to reclaim the reaction product, the apparatus 200 is not so limited.

Referring now to FIGS. 9 and 10, it will be seen that after the formation of a sufficient amount of reaction product, the member 216 is withdrawn in the direction of the left hand arrow cleaning off product accumulation that has formed on the blade member 226 and continual movement of the member 216 along the support plate 220 positions it under the auger cleanout means 242 as seen in FIG. 10. The FIG. 9 illustration shows the auger member 242 in the uppermost non-cleaning position. However, when the member 216 is in proper position, the auger member 242 is lowered and is rotated so as to clean accumulated product from the reaction zone 206 and collection zone 208 so that it falls into the opening 238 and thence into collector means 240.

After the scraping or cleaning has been accomplished, the means 242 is simply withdrawn to the uppermost position as shown in FIGS. 5 and 9 and the member 216 moved back into process position by means of handle or drive means 222 as shown in FIG. 5 and the collection process resumed by the disposition of blade 226 into the interior of member 216 all without interruption by a prolonged period of time and all without shutting down the reactor 202 so that the process utilizing the apparatus 200 is almost a continuous one.

Figure 12:
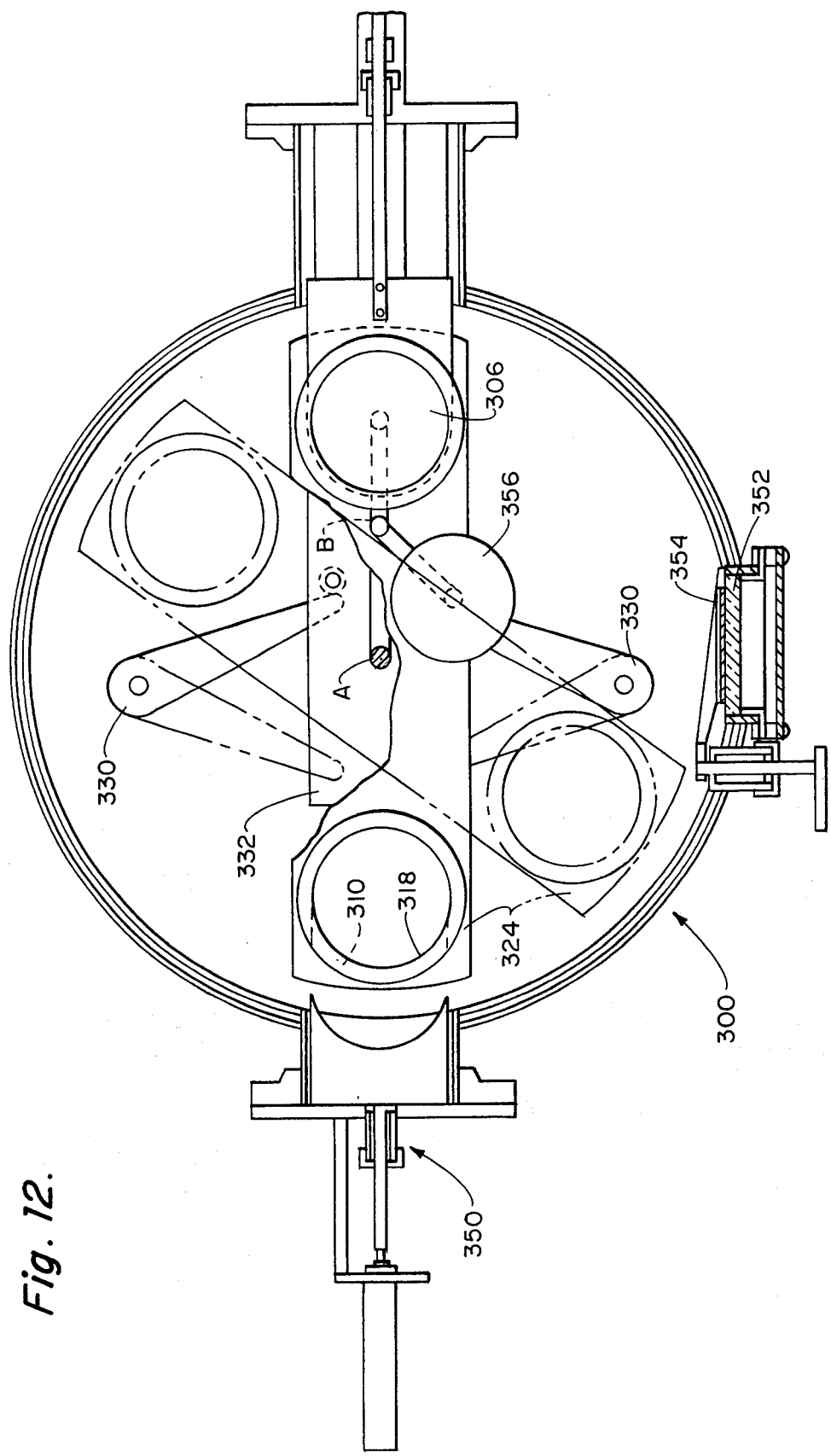
FIG. 12 is a top view of the apparatus shown in FIG. 11, with the top plates removed and parts omitted for the purpose of clarity.

Referring now to FIGS. 11 and 12, a more sophisticated apparatus will now be described which differs little from the process of the invention hereinabove referred to and excels over the apparatus shown in FIGS. 5 et seq. in that little interruption is involved in carrying out the process such that it is a continuous one for all practical purposes.

Referring to FIGS. 11 and 12, it will be seen that the apparatus 300 provides for practice of the invention on a continuous process basis as will now be described.

During normal operation, feed material is introduced into the plasma stream emanating from the plasma generator assembly 302. The feed material enters the reaction zone 304 through four tubular ports equally spaced around, and inclined toward, the plasma stream. As previously described, reduction of the feed material by the reducing gas which forms the plasma takes place in the reaction zone 304 which is the volume formed by the throat 306 above the blade 308, when in the dotted line operative position.

At the beginning of the reaction cycle, the blade 308 is fully extended into the slot 310 in the throat 306, nearly making contact with the side of the throat 306 opposite the slot 310. This ensures proper pressure drop (about 3 psi differential) across the gap 312 formed by the blade 308 and the interior wall of the throat 306. As metal sponge, for example, begins to form and fill the gap 312, a differential pressure sensor (not shown) signals the blade lead screw drive motor (not shown) to slowly withdraw the blade 308 until the pressure inside the reaction zone 304 is reduced to its preset level (about 3 psi differential).

When the blade 308 has been withdrawn to a predetermined point, or when the metal sponge deposit has increased to such an extent that the pressure in the reaction zone can no longer be controlled by retraction of the blade 308, feeding of the reactants is terminated, the blade 308 is completely withdrawn from the throat 306, as seen in full line, and the pneumatic throat clamp assembly 314 lowers the rotary throat assembly 316 which supports both throats 306 and 318. When the top 320 of throat 306 is clear of the quench top 322, a rotary pneumatic actuator (not shown) rotates the rotary throat assembly 324 one half turn (from left to right as seen in FIG. 12). This action permits the throat 306 containing the newly deposited metal sponge to be positioned under the boring mechanism assembly 326 mounted on the quench top 328. At the same time, a "clean" throat 318 is moved from its position under the boring mechanism assembly 326 to a position under the plasma head assembly 302. When this movement is complete, the throat clamp assembly 314 raises the rotary throat assembly 324 until the throats 306 and 318 are clamped against the quench tops 322 and 328. This action signals the throat slide actuators 330 to move the throat slide 332 from one end A of the rotary throat assembly 324 to the end B (FIG. 12). The throat slide 332 is channel mounted on assembly 324 to form one end of the collector zone 331.

The base plate 334 of the rotary throat assembly 316 is provided with an opening 336 under the throats 306 and 318 to permit removal of the formed metal sponge. However, it is necessary to seal these openings during the reaction phase of the cycle. This is accomplished by the throat slide 332 which is positioned by the throat slide actuator 330. After the rotary throat assembly 324 has been rotated 180° and clamped to the quench top 322 the throat slide actuators 330 reposition the throat slide 332 under the throat located under the plasma head assembly 302.

Thereafter, the blade 308 is moved into the slot 310 in the throat 306. When the blade 308 has fully penetrated into the throat 306 a feed metering assembly introduces feed material into the reaction zone 304, beginning a new reaction cycle. At the time the blade 308 begins to enter the slot 310 of one throat 306, for example, the boring mechanism 338 begins to clean the metal sponge deposit from the other throat 318.

The boring mechanism 338 consists of an electric motor chain-driving a pair of ball-bearing nuts which ride on ball screws fastened to the boring assembly base plate 326. As the nuts rotate, the motor and nut assembly is caused to move downward. Simultaneously, an extension 340 of the motor shaft projecting into the throat 318 through a packing gland 342 in the quench top 328, is rotated by the boring assembly motor. This combined rotation and downward travel causes crossbar 344 fastened to the shaft extension, to sweep the interior of the throat 318, breaking loose the deposits of metal sponge, which fall through the hole 336 in the rotary throat assembly 324 and into the sponge collector 346 located below the boring mechanism 338.

Adjacently positioned to the throat to be "cleaned" is blade slot and effluent clean out mechanism 350. The mechanism 350 is pneumatically operated for reciprocal movement from left to right as seen in FIG. 11, to effect removal of "plugs" of metal sponge or the like that has accumulated in the blade slot 310 and effluent ports 349 located in each of the throats 306 and 318.

The gaseous products of the reaction flow past the blade 308 and out through the quench exhaust tube 348. Entrained in this gas stream is the fraction of the metal not captured as sponge at the gap 312 formed by the blade 308 and the throat 306. Removal of the major part of this gas-entrained metal powder is accomplished as the gas stream flows into a cyclone collector system (not shown).

The apparatus 300 may also be provided with window 352 for visual observation and is provided with window shutter 354 which is pivotally mounted to cover over window 352. Should the need arise, wherein the reactor head 302 must be removed, and in order to prevent foreign matter from entering the quench or reaction zones, shutter 356 is pivotally affixed for positioning over the opening formed by removal of the plasma generator 302.

The means of accomplishing the actuation of the various components of apparatus 300 are within the skill of the ordinary worker of the art and form no part of the herein-disclosed invention, and thus, further reference to same will not be made.

Using apparatus as depicted in FIG. 3, a series of runs were made to ascertain the efficacy of the invention in the halogenation of columbium oxide. The apparatus employed a carbon lined reaction zone with a carbon collector means. The following Table VI accurately depicts the result of an exemplary run wherein columbium pentoxide was reacted with carbon tetrachloride to produce columbium chloride

TABLE VI

|  | Stabilizer Gas | Feed Carrier Gas | Feed Material | Recov'd Product | By-Product |
|---|---|---|---|---|---|
| RUN A | Argon, Nitrogen | Argon | $Cb_2O_5$, $CCl_5$ | $CbCl_5$ | $Co, Cl_2$ |

Spectrographic analysis confirmed the recovery of a yellow powder of columbium pentachloride.

Another test was conducted in order to establish the ability to form a metal alloy using the method and apparatus of the invention. The results of this test are embodied in Table VII.

TABLE VII

|  | Stabilizer Gas | Feed Carrier Gas | Feed Material | Recov'd Product | By-Product |
|---|---|---|---|---|---|
| RUN B | Argon, Hydrogen | Argon | $CbCl_5$ $SnCl_2$ | $Cb_3Sn$ | $HCl$ |

X-ray diffraction analysis confirmed the identity of the recovered product.

Still another test was conducted to ascertain the effectiveness of removing contaminating oxides from tungsten sludge.

Another series of tests were run using the apparatus of FIGS. 5-10, to reduce ammonium paratungstate (APT) to the elemental metal. These runs are shown in TABLE VIII. The reaction zone was graphite with a tungsten lining and the blade was graphite.

TABLE VIII

| RUN | Stablizer Gas | Feed Carrier Gas | Feed Material | Recov'd Product | By-Product |
|---|---|---|---|---|---|
| C | Hydrogen | Argon | APT | Tungsten | $H_2O, N_2, O_2$ |
| D | Hydrogen | Argon | APT | Tungsten | $H_2O, N_2, O_2$ |
| E | Hydrogen | Argon | APT | Tungsten | $H_2O, N_2, O_2$ |
| F | Hydrogen | Argon | APT | Tungsten | $H_2O, N_2, O_2$ |

The use of a cooled blade, as shown in FIG. 7A was found to permit the development of small or fine particles of the metal, while an uncooled blade allowed recovery of particles having a micron size range considerably larger than when the blade is cooled by water or other coolants.

Use of the apparatus and method of the invention is also suitable for halogenation. For example, a feed material of columbium oxide is fed to the reaction using nitrogen for the plasma generation and either carbon tetrachloride or carbon and chlorine is fed into the reaction zone. The product obtained is columbium chloride which is then recycled through the reactor but using a reductant such as hydrogen. The columbium chloride is reduced to yield columbium in the elemental metal form. Likewise, a mixture of columbium oxide and tin oxide is subjected to chlorination which product is then reduced to produce an alloy mixture of columbium and tin.

Using the invention and apparatus of the invention wherein a fixed gap reaction zone is maintained, (because of the gaseous state of the reactants) and utilizing a reaction zone lined with materials that are inert under reaction actions and to the desired end, reaction products, (graphite for example) high temperature chemical reactions may be carried out. Under such conditions, synthesis, halogenations and other high tempera-ture reactions may be carried out to increase yields of desired end products using a minimum of conversion energy.

Methane is introduced into the reactor while maintaining a pressure differential in the reaction zone of about 0.5–3.0 psig. The recovered products are acetylene and hydrogen which latter product is recycled into the reactor for plasma generation. So also are other high temperature reactions carried out using various feed materials as those of ordinary skill in the art will recognize. Thus, hydrocarbons such as acetylene, benzene and other high temperature reaction products are produced in greater quantities using lower energy requirements.

It will be readily observed from the foregoing detailed description, examples and data that numerous variations and modifications may be effected without departing from the essence and scope of the invention hereof.

We claim:

1. A process for halogenating refractory metal oxides comprising:
   introducing a high temperature electric arc plasma stream into a confined reaction zone maintained at or slightly above atmospheric pressure,
   heating the reaction zone to a temperature between approximately 1800° and 5000° K,
   introducing the oxide and halogenating agent into said confined reaction zone downstream of the anode used in forming said arc,
   passing the reaction products from said confined reaction zone through a restricted passageway into a collection zone, and
   maintaining a pressure differential of approximately 0.5 to 5 psig between said reaction zone and said collection zone by varying the size of said restricted passageway during the course of the reaction.

2. The process in accordance with claim 1 in which the refractory metal oxide is from the group consisting of tantalum, molybdenum and columbium.

3. The process in accordance with claim 2 in which the refractory metal oxide is columbium oxide.

4. The method in accordance with claim 3 in which the halogenating agent is a combination of carbon and chlorine.

5. The process in accordance with claim 4 in which the halogenating agent is carbon tetrachloride.

* * * * *